(12) United States Patent
Drent et al.

(10) Patent No.: US 7,684,145 B2
(45) Date of Patent: Mar. 23, 2010

(54) METHOD AND SYSTEM FOR PERPENDICULAR MAGNETIC MEDIA METROLOGY

(75) Inventors: William Van Drent, Best (NL); Ferenc Vajda, Winchester, MA (US)

(73) Assignee: MicroSense, LLC, Lowell, MA (US)

( * ) Notice: Subject to any disclaimer, the term of this patent is extended or adjusted under 35 U.S.C. 154(b) by 275 days.

(21) Appl. No.: 11/692,762

(22) Filed: Mar. 28, 2007

(65) Prior Publication Data

US 2007/0262771 A1 Nov. 15, 2007

Related U.S. Application Data

(63) Continuation of application No. 11/432,730, filed on May 11, 2006.

(51) Int. Cl.
G11B 5/00 (2006.01)
G11B 5/127 (2006.01)

(52) U.S. Cl. .............. 360/97.01; 360/125.02; 360/125.03; 360/125.16; 360/125.3; 360/137

(58) Field of Classification Search .......... 360/97.01, 360/125.02, 125.03, 125.16, 125.3, 137
See application file for complete search history.

(56) References Cited

U.S. PATENT DOCUMENTS

| | | | |
|---|---|---|---|
| 2,593,189 A | 4/1952 | Rinia | |
| 4,585,348 A | 4/1986 | Chastang | |
| 4,650,333 A | 3/1987 | Crabb | |
| 4,745,509 A * | 5/1988 | Watanabe et al. | 360/125.02 |
| 4,851,276 A | 7/1989 | Kitahata | |
| 4,870,631 A | 9/1989 | Stoddard | |
| 4,873,430 A | 10/1989 | Juliana | |
| 4,999,510 A | 3/1991 | Hayano | |
| 5,003,423 A * | 3/1991 | Imamura et al. | 360/125.03 |
| 5,125,741 A | 6/1992 | Okada et al. | |
| 5,189,481 A | 2/1993 | Jann | |
| 5,270,794 A | 12/1993 | Tsuji | |
| 5,353,171 A * | 10/1994 | Suzuki et al. | 360/59 |
| 5,392,116 A | 2/1995 | Makosh | |
| 5,416,594 A | 5/1995 | Gross | |
| 5,610,897 A | 3/1997 | Yamamoto | |
| 5,633,747 A | 5/1997 | Nikoonahad | |
| 5,644,562 A | 7/1997 | de Groot | |
| 5,798,829 A | 8/1998 | Vaez-Iravani | |
| 5,864,394 A | 1/1999 | Jordan | |
| 5,880,838 A | 3/1999 | Marx | |
| 5,903,342 A | 5/1999 | Yatsugake | |
| 5,985,680 A | 11/1999 | Singhal et al. | |
| 5,986,763 A | 11/1999 | Inoue | |
| 5,995,226 A | 11/1999 | Abe | |
| 6,031,615 A | 2/2000 | Meeks | |
| 6,081,325 A | 6/2000 | Leslie | |
| 6,130,749 A | 10/2000 | Meeks | |
| 6,198,533 B1 | 3/2001 | Meeks | |
| 6,229,610 B1 | 5/2001 | Meeks | |
| 6,268,919 B1 | 7/2001 | Meeks | |
| 6,392,749 B1 | 5/2002 | Meeks | |
| 6,498,697 B1 | 12/2002 | Klimovitsky | |
| 6,624,884 B1 | 9/2003 | Imaino | |
| 6,665,078 B1 | 12/2003 | Meeks | |

(Continued)

Primary Examiner—Jefferson Evans
(74) Attorney, Agent, or Firm—Luedeka, Neely & Graham, P.C.

(57) ABSTRACT

A metrology system for measuring the magnetic properties of a magnetic recording medium layer on a device used for perpendicular recording.

48 Claims, 18 Drawing Sheets

U.S. PATENT DOCUMENTS

| | | |
|---|---|---|
| 6,687,008 B1 | 2/2004 | Peale et al. |
| 6,704,435 B1 | 3/2004 | Imaino |
| 6,717,671 B1 | 4/2004 | Meeks |
| 6,751,044 B1 | 6/2004 | Meeks |
| 6,757,056 B1 | 6/2004 | Meeks et al. |
| 6,781,103 B1 | 8/2004 | Lane |
| 7,286,229 B1 | 10/2007 | Meeks |
| 2002/0015146 A1 | 2/2002 | Meeks |
| 2002/0034107 A1* | 3/2002 | Saito ........................ 365/200 |
| 2002/0118359 A1 | 8/2002 | Fairley |
| 2002/0131214 A1* | 9/2002 | Covington et al. ......... 360/324 |
| 2002/0145740 A1 | 10/2002 | Meeks |
| 2002/0163634 A1 | 11/2002 | Meeks |
| 2003/0025905 A1 | 2/2003 | Meeks |
| 2004/0017561 A1 | 1/2004 | Meeks |
| 2004/0046959 A1 | 3/2004 | Meeks |
| 2004/0075931 A1* | 4/2004 | Kim et al. ...................... 360/66 |
| 2004/0160604 A1 | 8/2004 | Meeks |
| 2004/0169850 A1 | 9/2004 | Meeks |
| 2004/0233419 A1 | 11/2004 | Meeks |
| 2005/0022586 A1* | 2/2005 | Hu et al. ....................... 73/105 |
| 2005/0023491 A1 | 2/2005 | Young |
| 2005/0057747 A1 | 3/2005 | Meeks |
| 2005/0204285 A1* | 9/2005 | Kikugawa et al. ............ 715/704 |
| 2005/0286156 A1* | 12/2005 | Shimamura et al. ...... 360/77.08 |
| 2007/0297078 A1* | 12/2007 | Nagao et al. .................. 360/17 |
| 2008/0037152 A1* | 2/2008 | Wang et al. ................... 360/31 |

* cited by examiner

METHOD AND SYSTEM FOR PERPENDICULAR MAGNETIC MEDIA METROLOGY

RELATED APPLICATIONS

This application is a continuation of U.S. patent application Ser. No. 11/432,730 filed May 11, 2006, by William Van Drent, entitled Method and System for Perpendicular Magnetic Media Metrology, the disclosure of which is incorporated herein by reference in its entirety.

TECHNICAL FIELD

The present invention relates generally to the field of metrology and more particularly to the field of a metrology system for magnetic media used for perpendicular recording.

BACKGROUND

Previously, in magnetic recording technology, increasingly higher data densities have been stored on disk drives using what is known as longitudinal recording techniques. As seen in FIG. 3 (Prior Art), in longitudinal recording the magnetization on the recording medium is switched between lying parallel and anti-parallel to the direction in which the write head is moving in relation to the surface. Although increases in areal densities of nearly 100 percent every year or two for the last several years have been achieved with longitudinal techniques, it is believed that the superparamagnetic limit is beginning to limit the capacities of this kind of recording. As a result, perpendicular recording is being adopted by many manufacturers to find ways to further increase areal density. In perpendicular recording, instead of "lying down" as it were, in same plane as the disk or magnetic surface, the bits are recorded "perpendicularly" in the magnetic surface. This enables much higher recording densities.

Perpendicular recording enables the use of media with higher coercivity. The write heads used to record data perpendicularly must generate much stronger magnetic fields as a result. The higher the coercivity, the more thermally stable and therefore, the less likely the medium is to succumb to superparamagnetic effect at higher than present recording densities. However, at the same time, this means that many of the conventional methods of measuring the magnetic properties of recording media may be inadequate for perpendicular recording applications, as they may not have sufficient magnetic field strength to switch the higher coercivity media.

Perpendicular recording media typically consist of at least a perpendicular recording layer and a soft magnetic underlayer (SUL). To switch magnetization in the perpendicular recording layer, a sufficient perpendicular magnetic field has to be applied. As seen in FIG. 5 (Prior Art) in a perpendicular hard disk drive, this is done with a microscopic single pole tip (SPT) write head 30 at near contact distance (of the order of 10 nanometer). In this situation, the SUL 12 functions as a magnetic flux feedback path for the SPT head, practically doubling the field of the head by the magnetic image effect.

For disk testers in line with production machines, a flying SPT head on a spin stand is not practical. At this point one needs to know the macroscopic magnetic properties such as MRT and HR for immediate process feedback. These properties need to be measured with great accuracy and repeatability (both fractions of a percent), over a large area of the disk, and it has to be done quickly (of the order of 1 disk per minute). For this purpose a macroscopic recording head is a good solution. Current art for longitudinal macroscopic disk measurement uses for example macroscopic heads of 2.5 mm wide, positioned at approximately 25-100 micrometer from the disk. The head is not actually flying, it is positioned to a predetermined distance. Typically 3 tracks are measured, an outer diameter (OD), middle diameter (MD) and inner diameter (ID) track.

For a perpendicular tester with a macroscopic SPT write head, the soft underlayer is too thin to function as a magnetic flux feedback. The soft underlayer is typically less than 1 micrometer thick and therefore can not carry the flux from a core that is orders of magnitude larger. Without the flux feedback through the SUL, the perpendicular magnetic field strength of a macroscopic perpendicular SPT head is limited, and may not be enough to even write the perpendicular media. This is particularly true as it is expected that over the coming years, coercivity will creep up in order to enhance thermal stability of ever smaller magnetic bits. Furthermore, for a macroscopic tester to function properly, it has to be able to not only switch the magnetization, but also to drive fields high enough to achieve maximum remanence, typically at least 2.2× larger than coercivity.

The principle of a macroscopic head residing altogether on one side of a disk has worked in the past for longitudinal magnetic inspection and measurement equipment. However for perpendicular testing and inspection equipment this approach yields insufficient magnetic field perpendicular to the disk.

DISCLOSURE OF INVENTION

The present invention comprises a system of magnetic write and read heads suitable for the measurement of magnetic properties of magnetic thin films with a perpendicularly oriented magnetic recording layer. The system can perform a measurement of magnetic parameters of the recording layer whether or not a soft under layer (SUL) is present underneath the recording layer(s).

In an embodiment shown in FIG. 1, an encompassing macroscopic recording head 04, capable of generating perpendicular fields of sufficient magnitude to magnetize a perpendicularly magnetizable recording layer on a surface used for magnetic data storage is shown. The encompassing macroscopic recording head 04 is comprised of a yoke 00 and one or more coils 02. The yoke 00 is situated in such a way that one magnetic pole P1 is located on one side of the magnetic recording medium 06 on substrate 08 and one magnetic pole P2 is located on the other side of magnetic recording medium 06 on the other side of substrate 08. Magnetic flux closure will therefore be achieved through the magnetic thin film, substrate and any other thin film layers present. During the write process, the magnetic medium will reside partially inside the encompassing macroscopic recording head 04, as opposed to traditional systems that have magnetic recording heads mounted on one side of a platter or recording surface.

The magnetic recording medium 06 is moved laterally or rotated through the encompassing macroscopic recording head 04 while at the same time an alternating magnetic field is generated by the encompassing macroscopic recording head 04. The magnetic field is generated by applying a current to the coil(s) 02 present around the yoke 00. This process causes magnetic transitions to be written in the perpendicularly oriented magnetic recording medium layer 06. Due to the fact that magnetic flux closure is achieved with encompassing macroscopic recording head 04 through magnetic recording medium layer(s) 06 and a substrate 08 and, transitions can be written on magnetic recording medium layers 06 located on both sides of a substrate 08 of a disk at the same time.

To evaluate the magnetic properties of the magnetic recording medium layer 06, it is subsequently passed by a read head 05 as seen in FIG. 4. Here the magnetic flux changes induced by the moving media are translated into voltage changes. The voltage changes are subsequently amplified and digitized, and processed into magnetization magnitude information. By varying the write field and subsequently reading the recorded information with the read head 05, a multitude of magnetic parameters can be determined.

DETAILED DESCRIPTION OF THE INVENTION

Figure 1:
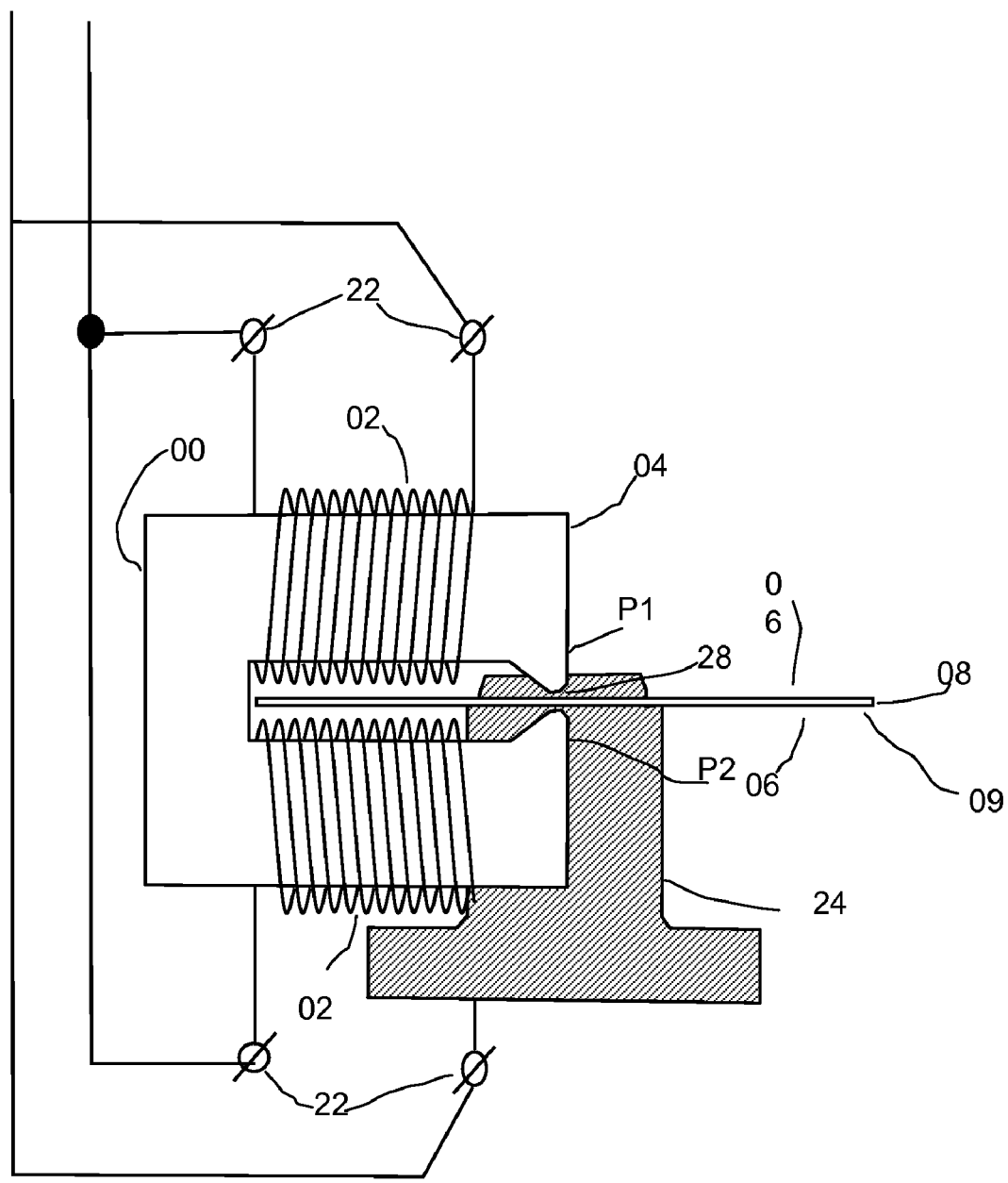
FIG. 1 is a schematic drawing of a side view of the macroscopic recording head of the present invention.

As seen in FIG. 1, the present invention comprises an encompassing macroscopic recording head 04, having a yoke 00, and one or more coils 02. Each coil 02 has electrical connections 22 to a coil driver for generating magnetic fields. In the embodiment shown in FIG. 1, the magnetic medium is a hard drive disk platter, here device 09, having magnetic recording medium layers 06 on its top and bottom surfaces, although it should be noted that some devices 09 do not have recording layers on both sides. Typically the recording medium is a magnetic thin film layer deposited over a substrate 08 with a soft underlayer SUL 12. All perpendicular media have SULs 12. However, some perpendicular hard disk drive devices 09 have a substrate 08 comprised of aluminum and some have a substrate 08 made of glass. The present invention can also be used to measure the magnetic properties of other perpendicular media, such as magnetic tapes or cards.

In the embodiment shown in FIG. 1, device 09 is mounted on a spindle 24. As can be seen, device 09 is positioned partially inside encompassing macroscopic recording head 04 between magnetic poles P1 and P2. In this embodiment, device 09 is rotated through encompassing macroscopic recording head 04 while an alternating magnetic field is generated by encompassing macroscopic recording head 04 as the result of applying a current to the coils 02 on yoke 00. As will be seen below, both encompassing macroscopic head 04 and device 09 can be positioned and moved in a variety of ways by transport mechanisms without deviating from the scope of the present invention.

Figure 1A:
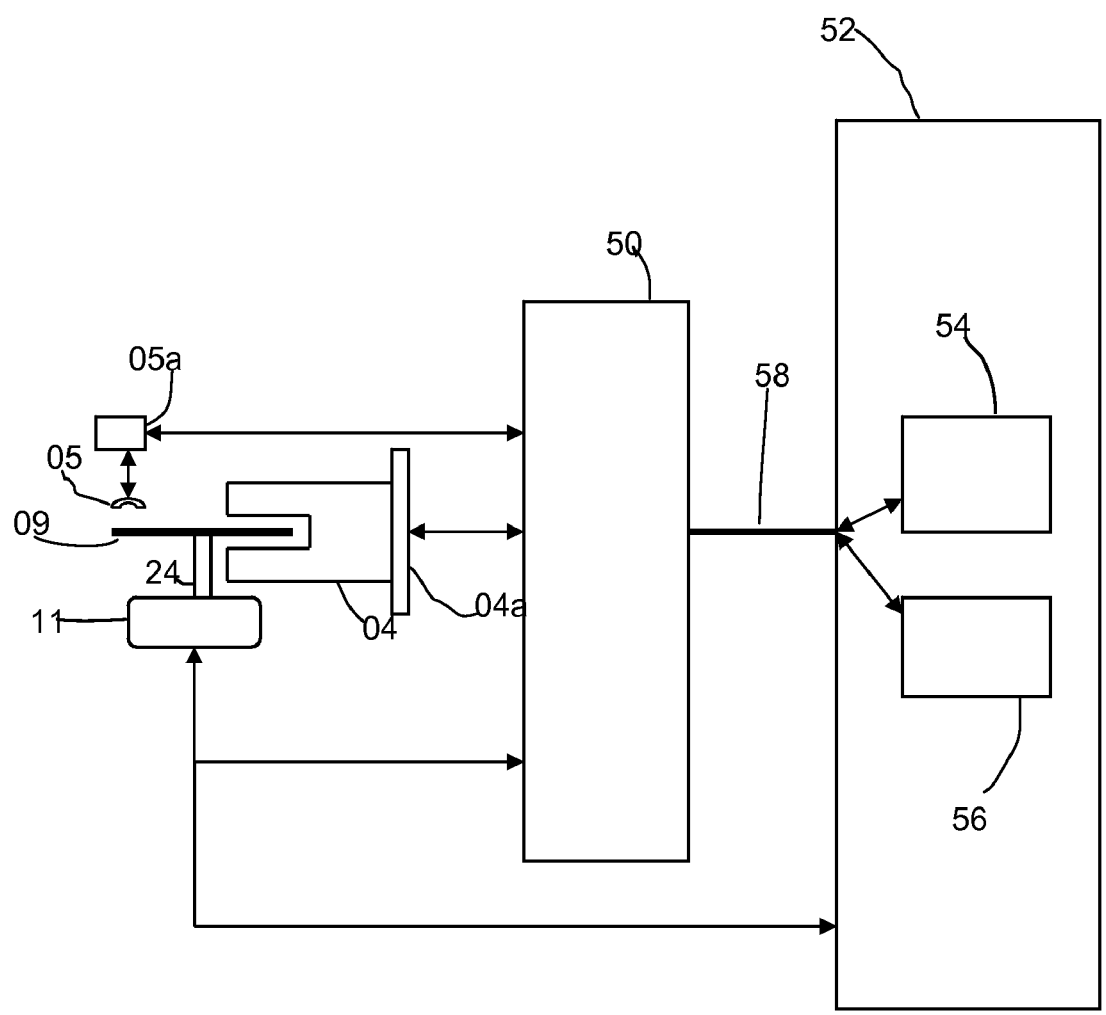
FIG. 1A is a schematic drawing of a computer system operating the perpendicular metrology system of the present invention.

With reference now to FIG. 1A, a block diagram of the present invention is shown as it is implemented with computer control. Computer system 52 communicates over input/output bus 58 to data acquisition and analog interface module 50. In computer system 52, control software 56 is used to configure the operation of the present invention as described above. Control parameters are sent over input/output bus 58 to data acquisition and analog interface module 50. Data acquisition and analog interface module 50 translates, as appropriate, the control parameters. Computer system 52 sends instructions to activate spindle motor 11 to rotate device 09 inside encompassing macroscopic recording head 04.

Still in FIG. 1A, data acquisition and analog interface module 50 translates control parameters to send appropriate voltages to driver 04a to initiate writes by encompassing macroscopic recording head 04, and also receives and translates signals returned by amplifier 05a from read head(s) 05, when data is read. In the embodiments shown conventional inductive read heads (05) are shown, but those skilled in the art will appreciate that magneto-resistive heads can be used as well. As test data is read back in from read head(s) 05, data acquisition and analog interface module 50 translates it into digital format and sends it to computer system 52, via input/output bus 58, for analysis by analysis software 54. Data acquisition and analog interface module 50 is able to use signals from an encoder (not shown) associated with spindle 24 to correlate these processes with the actual disk position of device 09 at any time.

In the embodiments shown, an IBM compatible personal computer running the Windows™ operating system from Microsoft is used as computer system 52. For the data acquisition module, any high speed multifunction IO card with simultaneous input and output capability can be used. This card could reside inside or outside computer system 52. In the embodiments shown, a high performance USB device called a Data Translation DT9836, is used, but other cards from Data Translation, National Instruments, or the like could be used as well. Those skilled in the art will appreciate that different configurations of computer systems, buses and interface modules and software programs can be used without deviating from the scope of the present invention. For example, additional controls and drivers can be implemented for the various transport mechanisms described herein.

Returning to FIG. 1, a sufficient current is applied to the coils 02 of the encompassing macroscopic recording head to generate magnetic fields strong enough to perpendicularly magnetize transitions in the magnetic recording media layers 06 when device 09 is partially inside encompassing macroscopic recording head 04. The placement of device 09 in gap 28 between magnetic poles P1 and P2 of encompassing macroscopic recording head 04 results in magnetic flux closure through all the layers that may be on device 09.

Figure 5:
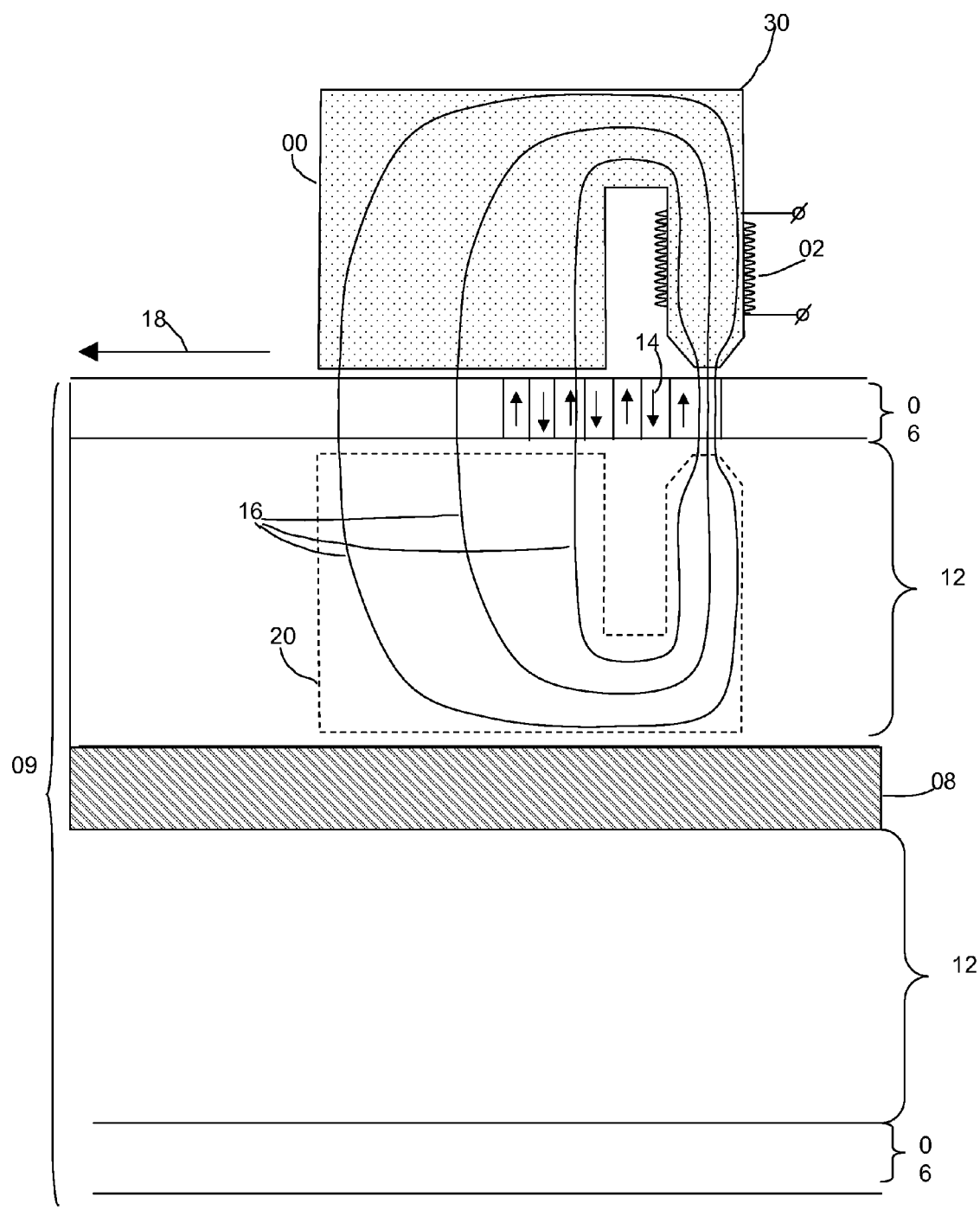
FIG. 5 (Prior Art) is a schematic drawing of a single pole tip write head of the prior art.

Turning briefly to FIG. 5 (Prior Art), for illustration purposes, an expanded view of the action of one coil 02 of a single pole tip head 30 used for normal perpendicular recording is shown. In this view, device 09 comprises magnetic recording medium layers 06 which are coated on top of a soft underlayer SUL 12 on both sides of an aluminum substrate 08. In reality substrate 08 is orders of magnitude thicker than shown in FIG. 05 (Prior Art). In disks manufactured for perpendicular recording techniques, SUL 12 is used to provide an efficient return path for the magnetic field flux indicated by flux lines 16. As is seen in FIG. 5 (Prior Art), it is known that use of an SUL 12 significantly enhances the magnetic field in the magnetic thin film recording layer, magnetic recording medium layers 06. The field flux lines 16 are widespread in SUL 12 and the resulting lower flux feedback field through magnetic recording medium layer 06 do not disturb the written perpendicular bits 14. This enhancement effect is one of the factors contributing to the ability to use recording layers with higher coercivity. The higher coercivity, in turn, requires that systems such as the present invention used to test such materials, must be capable of producing higher magnetic fields.

It should be noted that the single pole tip write head 30 shown in FIG. 5 (Prior Art) is microscopic in size compared to the macroscopic size of the present invention. Put another way, the size of a single pole tip head may usually be measured in micrometers, while the encompassing macroscopic recording head 04 of the present invention is typically measured in centimeters—a difference of 10,000 to 1 in linear dimensions or on the order of 10E12:1 in magnetic core volume.

Figure 2:
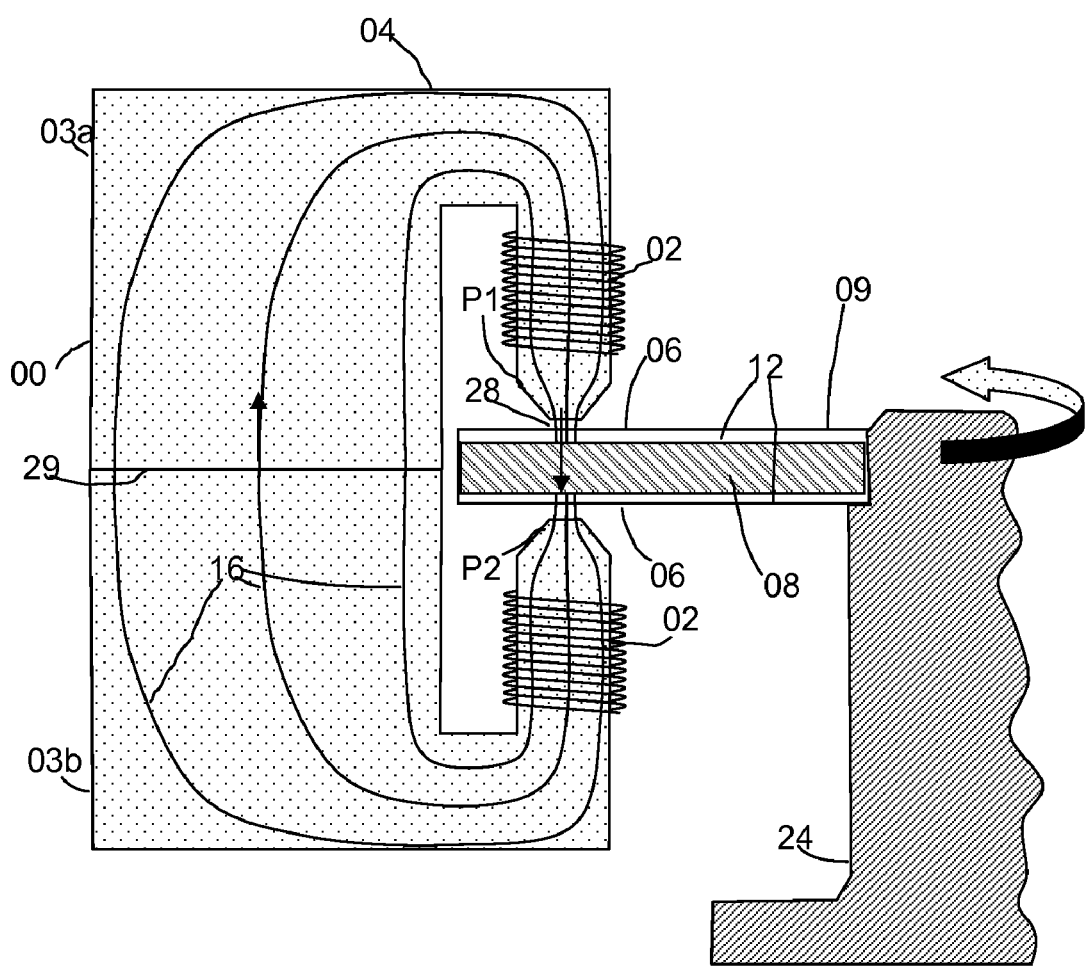
FIG. 2 is a schematic drawing of a cutaway view of the macroscopic recording head of the present invention.
Figure 3:
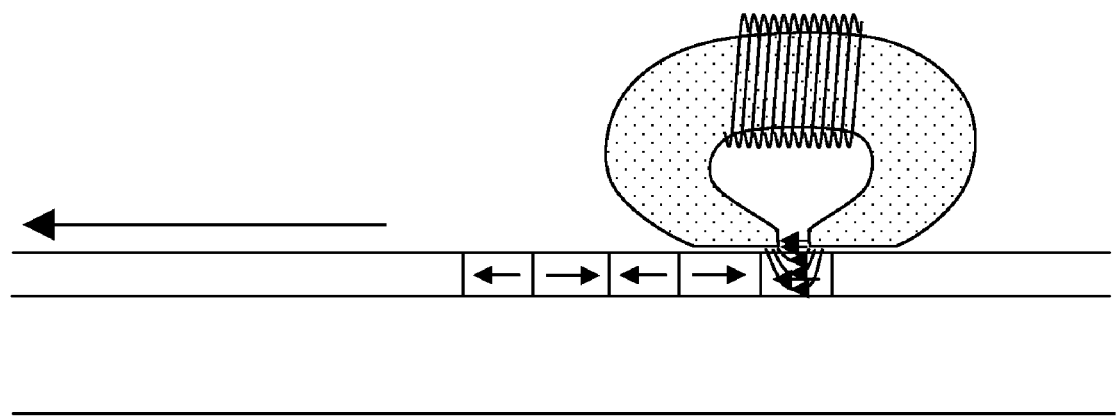
FIG. 3 (Prior Art) is a schematic drawing of the longitudinal recording technique of the prior art.

Turning now to FIG. 2, it can be seen that encompassing macroscopic recording head 04 in the embodiment shown here works much like a mirror image of a single pole tip head 30 such as that shown in FIG. 5 (Prior Art), albeit on a much larger scale. In FIG. 2, device 09, having magnetic recording medium layers 06 and SULs 12, on either surface of substrate 08, is placed partially inside the gap 28 between magnetic poles P1 and P2 of encompassing macroscopic recording head 04. In the embodiment shown, yoke 00 of encompassing macroscopic recording head 04 is made from HiperCo™ 50, manufactured by Carpenter. HiperCo™ 50 is an iron-cobalt-vanadium soft magnetic alloy that exhibits high magnetic saturation magnetization Ms (24 kilogauss), high D.C. maximum permeability, low D.C. coercive force, and low A.C. core loss. Yoke 00 could also be made from materials having similar properties, such as electrical iron or magnet iron, silicon steel or permendur. As with the HiperCO™50 of the present invention, all of these should be laminated to reduce eddy currents in the core. Sintering and annealing may also be used with such materials.

In the embodiments shown, yoke 00 is also sized to be orders of magnitude larger than a typical magnetic single pole tip head, and as mentioned, to have two at least two poles P1 and P2, opposite each other, and forming a gap 28.

Still in FIG. 2, for purposes of illustration but not limitation, yoke 00 of encompassing macroscopic recording head 04 has been built having dimensions of a 20×12 millimeter core area with a 40 millimeter long coil and a pole tip tapered to 2×6 millimeters with a 2 millimeter gap 28. In an embodiment shown, coils 02 have 100 turns and 150V/20 A drive available per coil 02. This yields a maximum field of approximately 20,000 Gs in the gap. To optimize the magnetic field for a particular gap 28 and write width, three dimensional magnetic simulations may be used, but typically an increase of core area of yoke 00 will increase the linear range of encompassing macroscopic recording head 04—the range where the field is proportional to the current. It will also increase the maximum attainable field. An increase of gap 28 should be accompanied by a proportional increase of all head dimensions to maintain performance. In the embodiments shown, the core dimensions are further determined by the maximum switching frequency required (a coil around a larger core has higher inductance, hence needs more voltage to drive.) In the embodiments shown, a poletip PLT size is determined by the need to have a homogeneous field distribution over a range that is slightly wider than the width of the read head. In the embodiments shown this resulted in a 2.5 mm read width and a 6 mm write width. Those skilled in the art will appreciate that encompassing macroscopic recording heads of varying dimensions, shapes, and properties can be constructed without deviating from the scope of the present invention.

Still in FIG. 2, power as high as 6000 watts for short durations (1 ms) has been applied to encompassing macroscopic recording head 04 to generate magnetic fields. In typical operation, however, the average dissipated power of the head over the measurement cycle is of the order of 3-15 W, based on the parameters of the field sequence that is applied in the measurement process. Generally speaking, in order for a metrology system to accurately test the recording medium layers 06, encompassing macroscopic recording head 04 needs to be able to generate magnetic fields that saturate the perpendicular recording media. In practice, this typically requires generating fields at least twice as high as the coercivity of the recording medium layers 06.

Still in FIG. 2, it should be noted that since encompassing macroscopic recording head 04 is orders of magnitude larger than a typical single pole tip write head used with perpendicular media, and is capable of generating very strong magnetic fields, it does not have to be built as a flying head. Instead, it can be sized to fit the thickness of most media to be tested in a particular category, such as thin film disks with aluminum substrates or disks with glass substrates. As will be discussed below, the present invention can also be used to test other perpendicular media, such as magnetic tape or cards.

Figure 6:
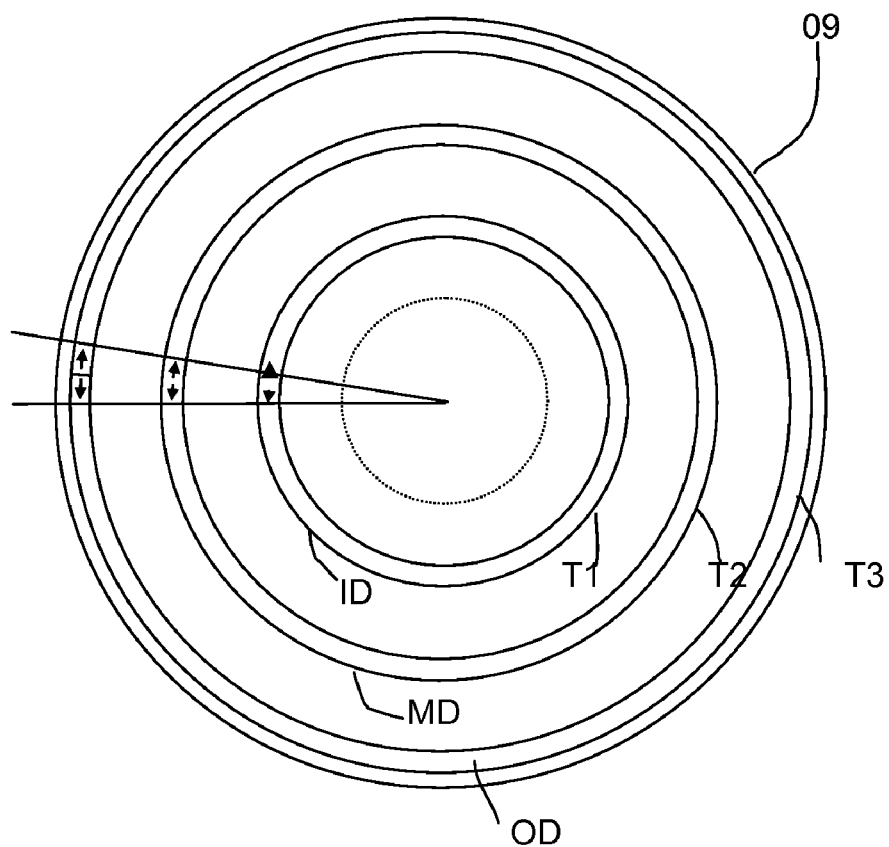
FIG. 6 is a schematic top view of a disk platter being tested by the present invention.

Turning now to FIG. 6, in a typical application, encompassing macroscopic recording head 04 is used to test the magnetic properties of a recording medium by writing three tracks, T1, T2 and T3 on both surfaces (if applicable) of a device 09. As can be seen, device 09 and encompassing macroscopic recording head 04 are positioned so that the tracks are written, in this example, as an inner diameter ID, a middle diameter MD and an outer diameter OD on both magnetic recording medium layers 06 of device 09. In the embodiments shown, three tracks are written on both sides of device 09 and in 32 sectors per track, so that a total of 192 data points, commonly called sectors, are available for analysis of the magnetic properties of the magnetic recording medium layers 06.

Figure 7:
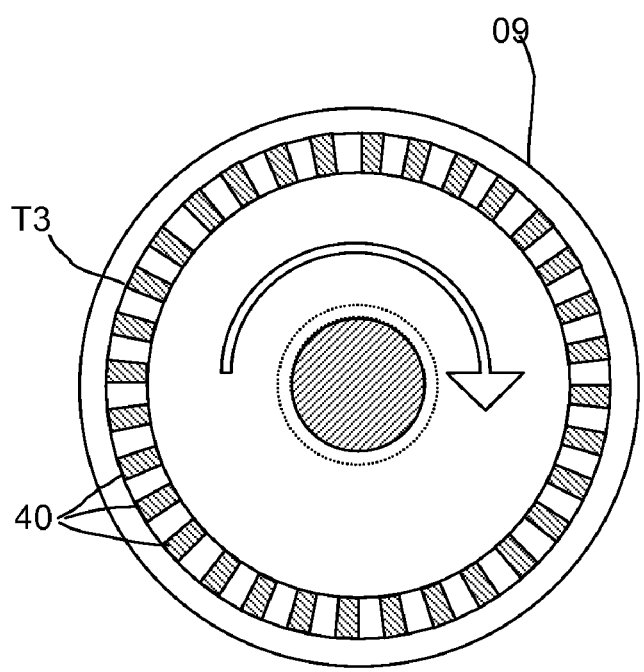
FIG. 7 is a schematic top view of a disk platter being tested by the present invention.

Turning briefly to FIG. 7, sectors 40 are shown written in track T3 of a device 09. When sufficient field is applied to switch the magnetic layer, the hatched areas indicate magnetization pointing up and the clear areas indicate magnetization pointing down. In the embodiments shown, the strength of the magnetic field may be varied. In the embodiments shown, for example, the first write of all 32 sectors 40 would use a large AC write current, enough to fully magnetically saturate the area of the disk inside the encompassing write head. The next write of all 32 sectors 40 then would use a predetermined lowest field strength in the opposite direction—usually a value that would be estimated to be too low to switch the media being tested. The third write of all sectors 40 would use a higher magnetic field strength, in some predetermined increment. In the embodiments shown, each of the writes would use consecutively higher magnetic field strengths until the $32^{nd}$ write of 32 sectors 40, which is written with the highest field strength. This field strength would typically be equal to the field strength in the first write, but the waveshape would be opposite in sign. In this way it is possible to ascertain how much magnetic field strength is needed to switch the media, when, after each write, the sectors 40 are read back.

Returning now to FIG. 6, those skilled in the art will appreciate that any number of variations of the recording patterns can be used without deviating from the present invention. For example, instead of three tracks, T1-T3, per side, two tracks might be written, using an encompassing macroscopic recording head 04 shaped to record a wider track width. Alternatively, more tracks could be written with an encompassing recording head 04 shaped to have a somewhat narrower track width. Similarly, the placement of the tracks can be varied by the positioning of the device 09 or the positioning of encompassing macroscopic recording head 04, or both. In addition, encompassing macroscopic recording head 04 can also be implemented with a gap 28 that is sized for a specific thickness of devices 09.

Figure 18:
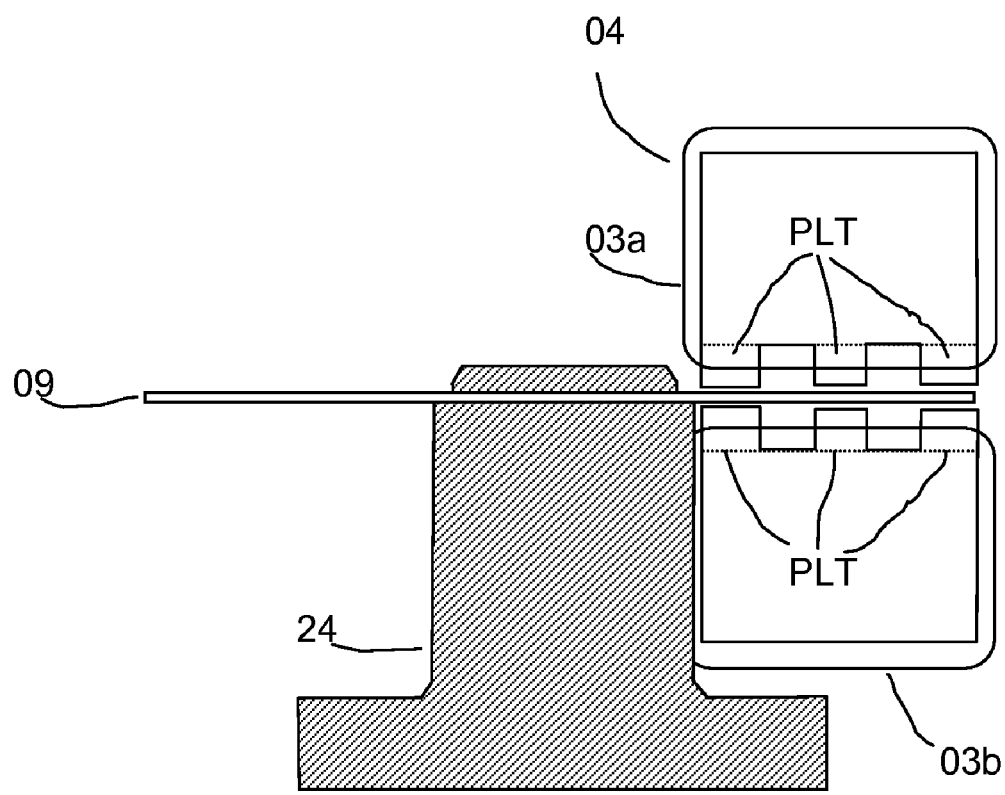
FIG. 18 is a schematic cutaway side view of an embodiment of the macroscopic recording head of the present invention.

Similarly, encompassing macroscopic recording head 04 can be constructed to have multiple poles P1 and P2 in one yoke, as seen in FIG. 18 where encompassing macroscopic recording head 04 has three sets of poles P1 and P2 created by using three poletips PLT on each arm 03 of encompassing macroscopic recording head 04. Those skilled in the art will appreciate that encompassing macroscopic recording head 04 can be constructed with varying numbers of poletips PLT per arm without deviating from the scope of the present invention. The number of poletips, and their size, may be varied to concentrate the field in specific areas and reduce eddy currents in disks made of conducting materials, such as disks having aluminum substrates 08.

Returning to FIG. 2, the embodiment shown depicts an encompassing macroscopic recording head 04 used in conjunction with a spindle 24. In this embodiment, device 09 is mounted on a chuck or spindle 24 which rotates device 09 inside gap 28 of encompassing macroscopic recording head 04.

Figure 10:
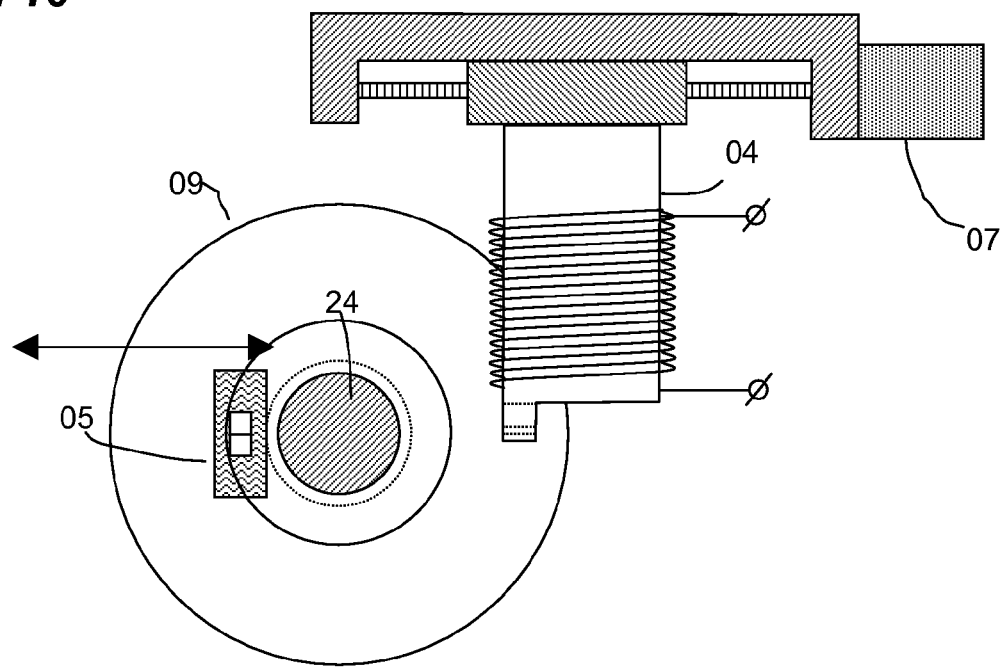
FIG. 10 is a top view of an embodiment of the macroscopic recording head of the present invention.
Figure 11:
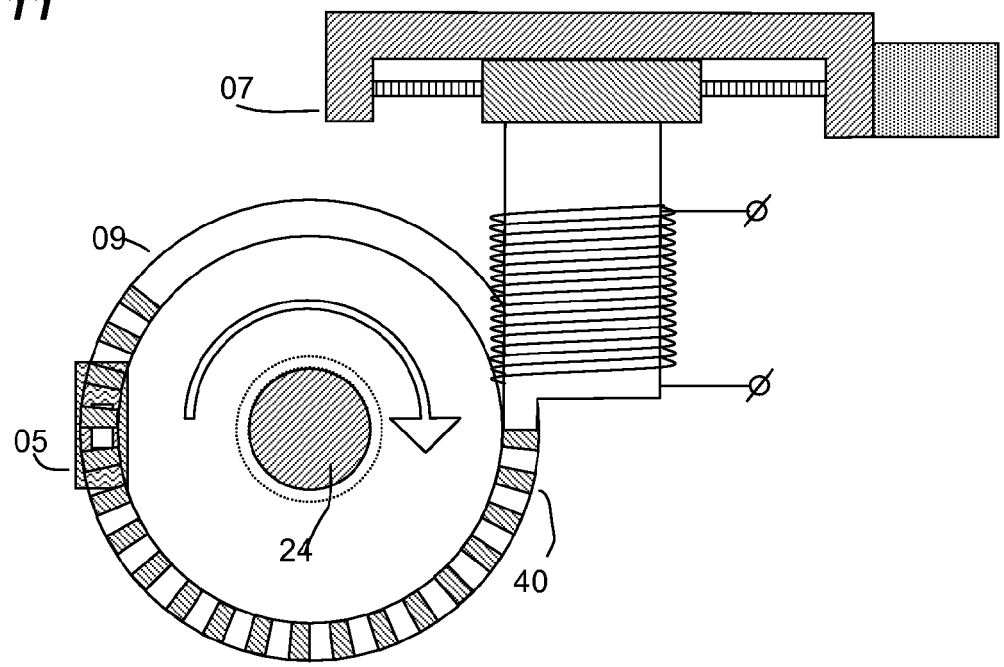
FIG. 11 is a top view of an embodiment macroscopic recording head of the present invention.
Figure 12:
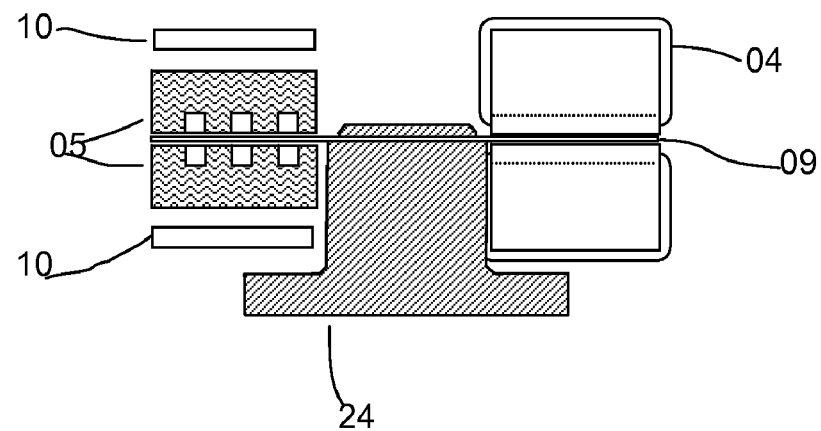
FIG. 12 is a schematic cutaway side view of an embodiment of the macroscopic recording head of the present invention.

Turning now to FIGS. 10 and 11, in this embodiment, encompassing macroscopic recording head 04 is shown mounted on a moving stage 07 so that encompassing macroscopic recording head 04 can be positioned to write at various locations on device 09. In this embodiment, the moving stage 07 and spindle 24 constitute one type of transport mechanism. Those skilled in the art will appreciate that the moving stage 07 shown on the top in these embodiments could also be placed on the back or the front without deviating from the scope of the present invention. Similarly, in this embodiment, a linear translation stage where the carriage is moved by means of a drive mechanism (motor and lead screw or ball screw, or a linear motor) along a linear guidance mechanism (crossed roller bearings, ball bearings, slide mechanism) is shown. Linear stages are known in the art.

Figure 19:
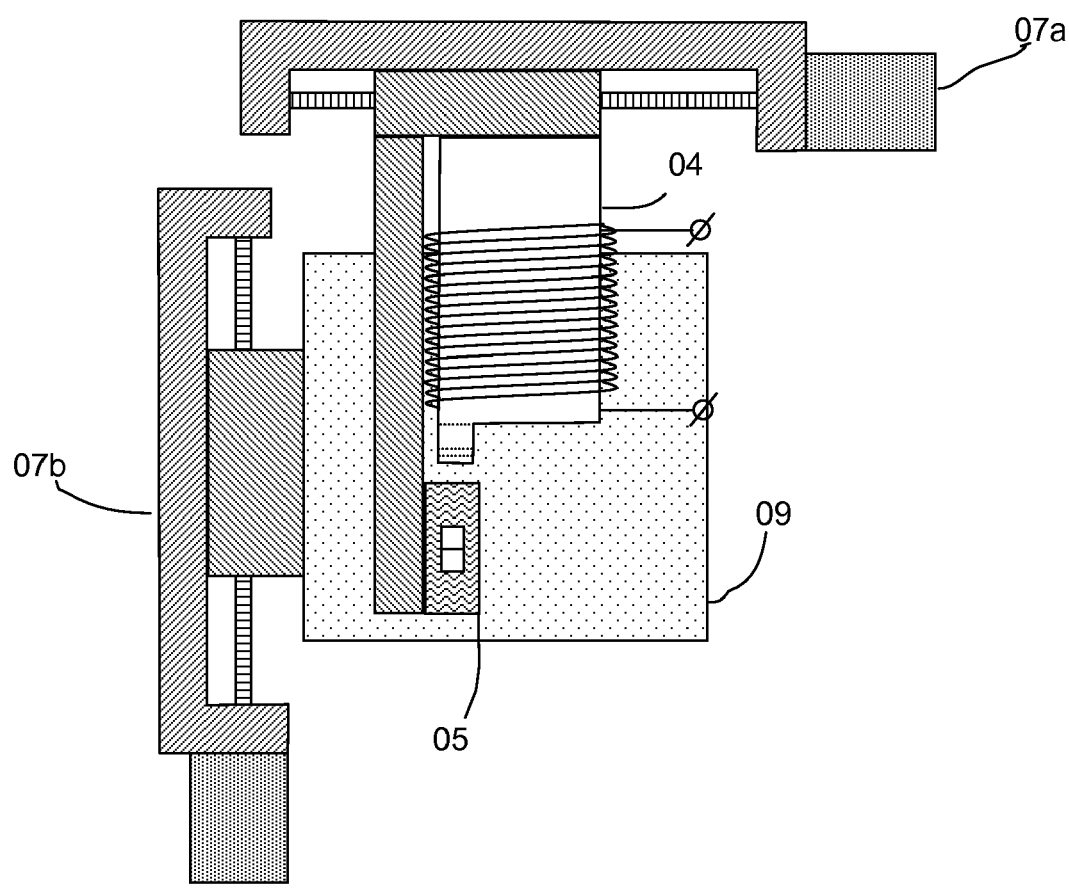
FIG. 19 is a schematic top view of an embodiment of the macroscopic recording head of the present invention.

In the embodiment shown in FIG. 19, encompassing macroscopic recording head 04 is shown with a different transport mechanism. In this implementation, device 09 is placed on a conveyer-like mechanism such as moving stage 07b which moves device 09 laterally inside encompassing macroscopic recording head 04. In this example, device 09 might be a magnetic card device being tested. Those skilled in the art will appreciate that the present invention can also be used to test and inspect magnetic tape used for perpendicular recording by reeling the tape as device 09, forward and backward on reels so that the tape device 09 passes through encompassing macroscopic recording head 04 and past a read head 05.

Figure 8:
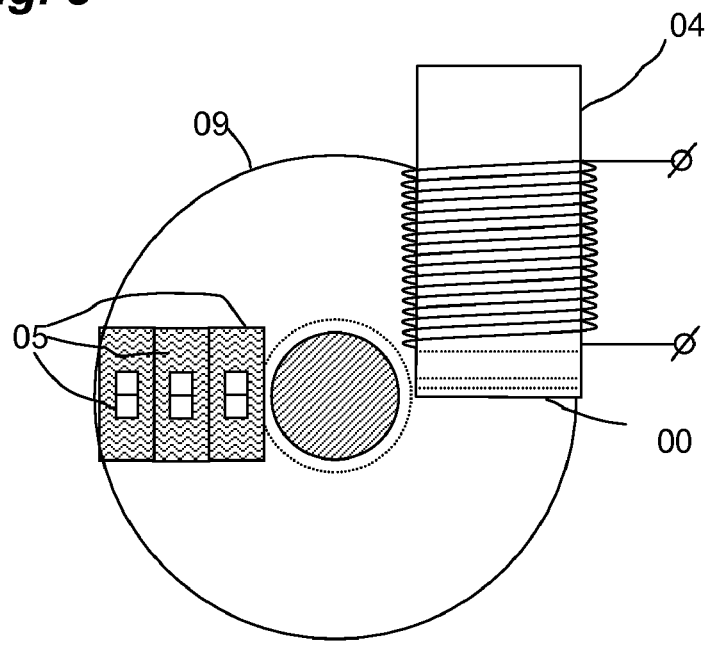
FIG. 8 is a schematic top view of an embodiment of the macroscopic recording head of the present invention.

Turning now to FIG. 8 a top view of an embodiment of the present invention is shown, in which encompassing macroscopic recording head 04 is stationary and device 09 is rotated. As can be seen in FIG. 8, read heads 05 are also positioned in a stationary manner. In FIG. 8, yoke 00 of encompassing macroscopic recording head 04 is shaped so that it is capable of writing a wide track width on the magnetic recording medium layer 06 of device 09.

Figure 9:
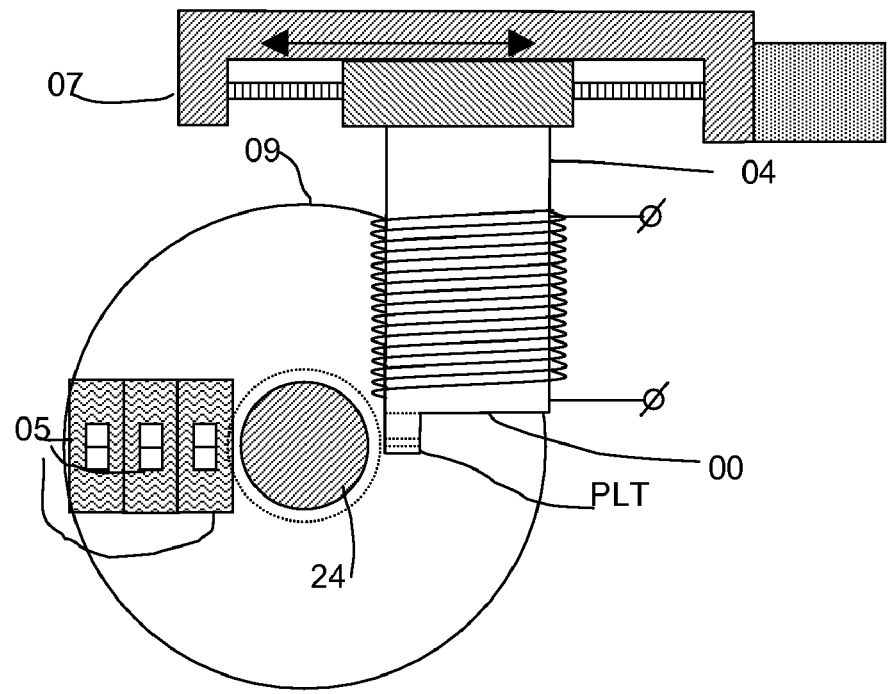
FIG. 9 is a top view of an embodiment of the macroscopic recording head of the present invention.

In FIG. 9, however, an embodiment with a configurable moving stage 07 transport mechanism is shown. In this example, encompassing macroscopic recording head 04 is moved over device 09 mounted on a spindle 24. Stationary read heads 05 are used to read back the recorded results for analysis. In this implementation, encompassing macroscopic recording head 04 has a yoke 00 shaped to have one set of poletips PLT that are narrower than that of FIG. 8, but can still write a single track at a time. This reduces inductance and thereby increases speed of operation and also reduces eddy currents in devices 09 having aluminum substrates 08. In this embodiment, encompassing macroscopic recording head is moved to the position where the radius of the center of poletip PLT is equal to the radius of the center of one of the read heads 05. Then a recording and readback sequence is executed. Encompassing macroscopic recording head 04 is moved to the appropriate position for the next read head 05 and a recording and readback sequence is executed again and so on. The sequences for different read heads 05 do not need to be the same nor do all read heads 05 have to be used.

In the embodiment shown in FIG. 9, a software program executing in a computer controlling encompassing macroscopic recording head 04 is used to select the sequences. Thus, in this configurable implementation, a sequence that is used to determine only MRT will execute faster than a sequence that determines all magnetic parameters. For purposes of illustration and not limitation, one could configure this implementation of encompassing macroscopic recording head 04 to determine only MRT on the inner diameter ID and the outer diameter OD, and all parameters only for the middle diameter MD. A number of different configurations of test and measurement sequences can thus be configured and computer controlled.

Returning now to FIG. 2, yet additional implementations of encompassing macroscopic recording head 04 can be illustrated. In FIG. 2, yoke 00 is shown as one piece having an upper arm 03a and a lower arm 03b around a center 29, in which center 29 is in the same plane as gap 28. In alternative embodiments, yoke 00 can be implemented with arms 03a and 03b as two separate pieces so that gap 28 extends through the entire head and device 09 can be inserted completely through encompassing macroscopic recording head 04. Alternatively, center 29 can be a gap filled with a gas or liquid or non-magnetic material or even with a magnetic material other than the core material.

Figure 4:
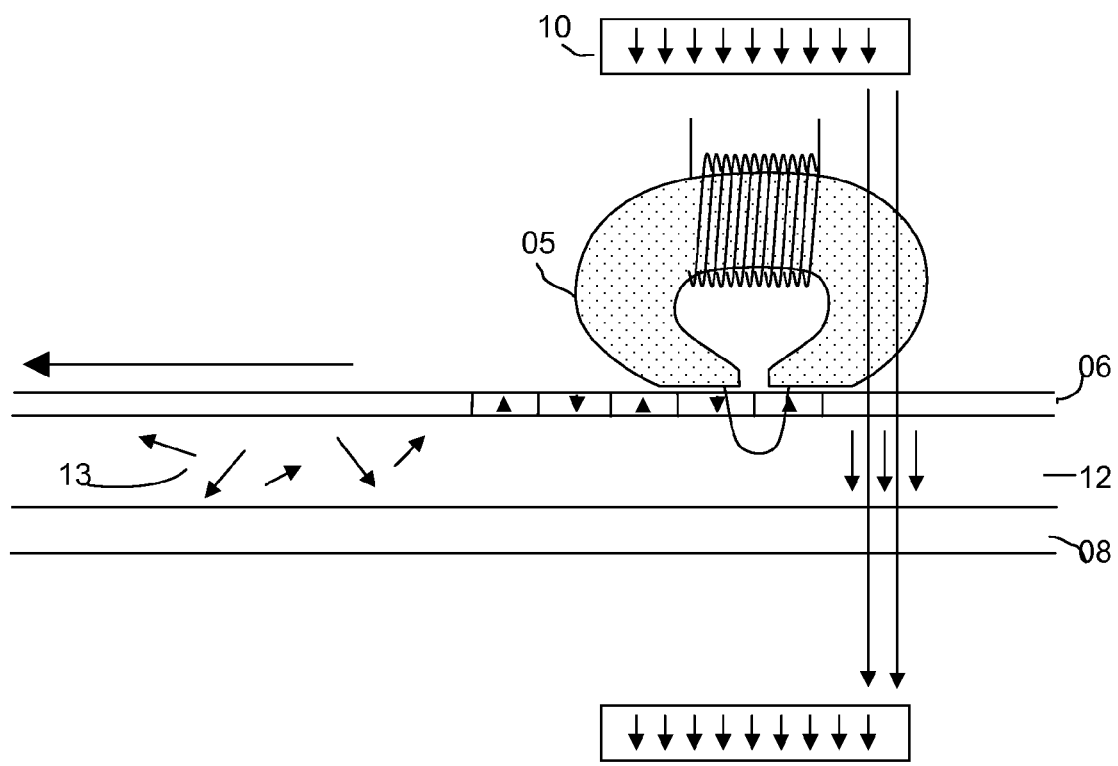
FIG. 4 is a schematic drawing of a read head of the present invention.

With reference now to FIG. 4, one factor in using encompassing macroscopic recording head 04 with devices 09 having soft underlayers, SULs 12, is that the orientation of the SUL 12 may cause noise when being read back by conventional read head 05. In order to minimize such noise, the present invention also incorporates a permanent magnet or similar static magnetic field 10, in connection with read head 05 to reduce noise, as depicted in FIG. 4. With the addition of the static magnetic field 10, SUL 12 is thereby oriented to reduce noise.

Still in FIG. 4, in most of the SULs 12 tested to date, it appears that SULs 12 are so magnetically soft that their magnetic orientation is not stable over time. In tests of spinning media, each region of SUL 12 goes into encompassing macroscopic recording head 04 and then towards a read head 05. Even with encompassing macroscopic recording head 04 turned off, some remnant magnetic field may remain and may be enough to disturb SUL 12 each time SUL 12 passes through encompassing macroscopic recording head 04. A typical SUL 12 has a preferred orientation in the plane of a disk, and it may be that each time SUL 12 passes through encompassing macroscopic recording head 04, the magnetic domains in the SUL 12 are briefly oriented perpendicular. Then when the area of the disk moves away, the SUL 12 domains fall back to their preferred in-plane orientation, but in a random pattern 13. This random pattern 13 appears as noise to the read head 05 on top of the perpendicularly recorded pattern. The random patterning of the SUL 12 seems to be the cause of the noise. Whether or not there may be other contributing factors to the noise problem, applying a small static magnetic field 10 near the read location in such a way as to minimize the randomness of the magnetic domain pattern of SUL 12 appears to mitigate noise significantly.

Figure 4A:
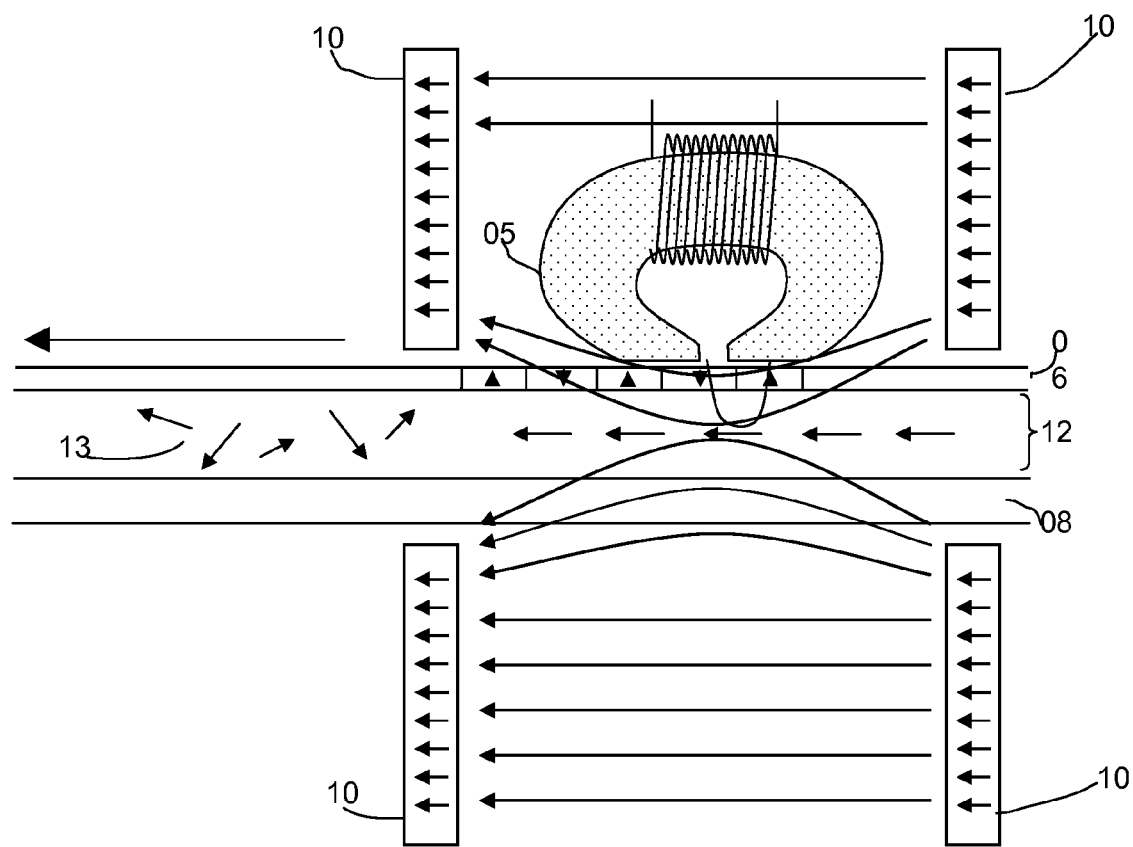
FIG. 4A is a schematic drawing of another embodiment of a read head of the present invention.

FIG. 4A, for example, illustrates how the use of several static magnetic fields 10 near the read head 05 but applied in a different direction has a similar effect. In the same way, applying direct current or alternating current fields in relation to read heads (05) also tends to reduce or stabilize signals coming from layers such as SUL 12, or layers other than the recording layer—magnetic recording medium layer 06. In the same way an arbitrary wave shape field designed to work with a read head 05 can also be used to reduce or stabilize signals from other recording layers.

Figure 13:
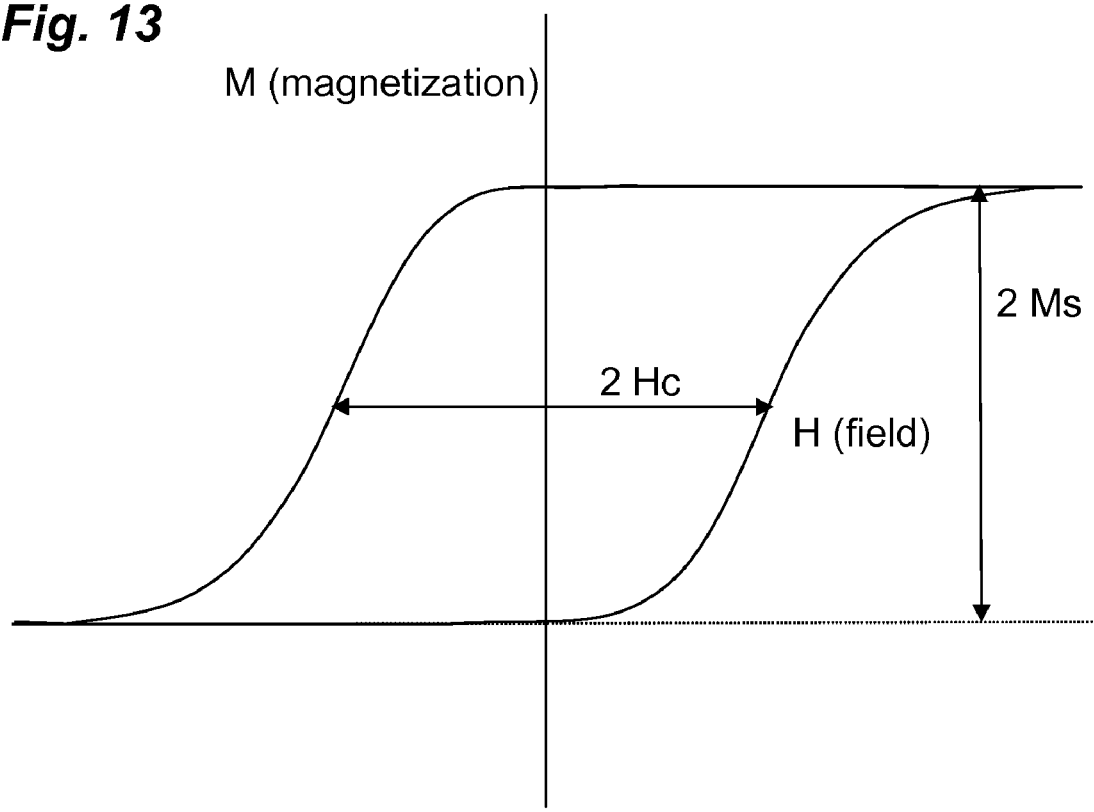
FIG. 13 is a graph of an hysteresis curve.

With reference now to FIG. 13, an hysteresis curve is shown, in which magnetization, M is shown on the vertical axis and magnetic field H is shown on the horizontal axis. As mentioned above, it is an object of the present invention to measure the magnetic properties of the recording medium layers 06 on devices 09. For a magnetic hysteresis loop of a perpendicular material, magnetization is measured in the presence of a perpendicular magnetic field. In the embodiments shown however, a perpendicular field is present during writing, but not during reading. This type of measurement is called a remanence loop. Here sectors 40 in a track T are written with varying field strengths, which allows magnetic remanence measurements to be made, as seen in FIG. 14.

Figure 14:
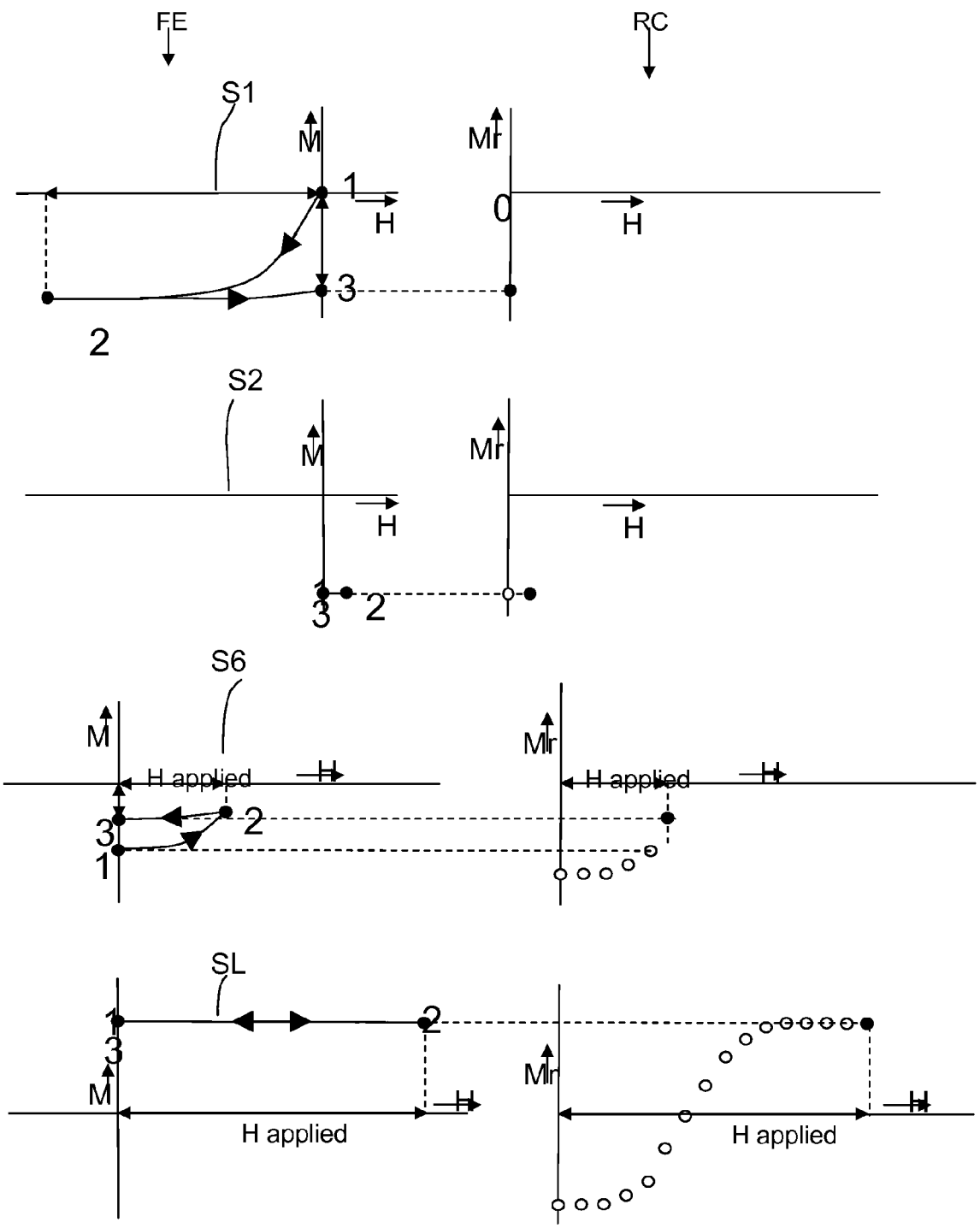
FIG. 14 is a schematic representation of test steps performed by the present invention.

In FIG. 14, the field excursions FE are shown on the left, in steps and the resulting remanence curves RC are shown on the right. At step S1, transitions with maximum excursion are applied. This is called the negative saturation step. At step S2, transitions with small excursion of opposite phase are applied. This is called a positive write step. In the embodiments shown, at least one, but typically two transitions are recorded on each sector 40. Increments of positive field excursions occur with each subsequent write step, such as that at step S6. At the last sector, step SL, transitions with maximum field excursion are applied. This is called the positive saturation step. The phase of the first step S1 is opposite or 180 degrees out of phase to all the following steps of the sequence.

Figure 16:
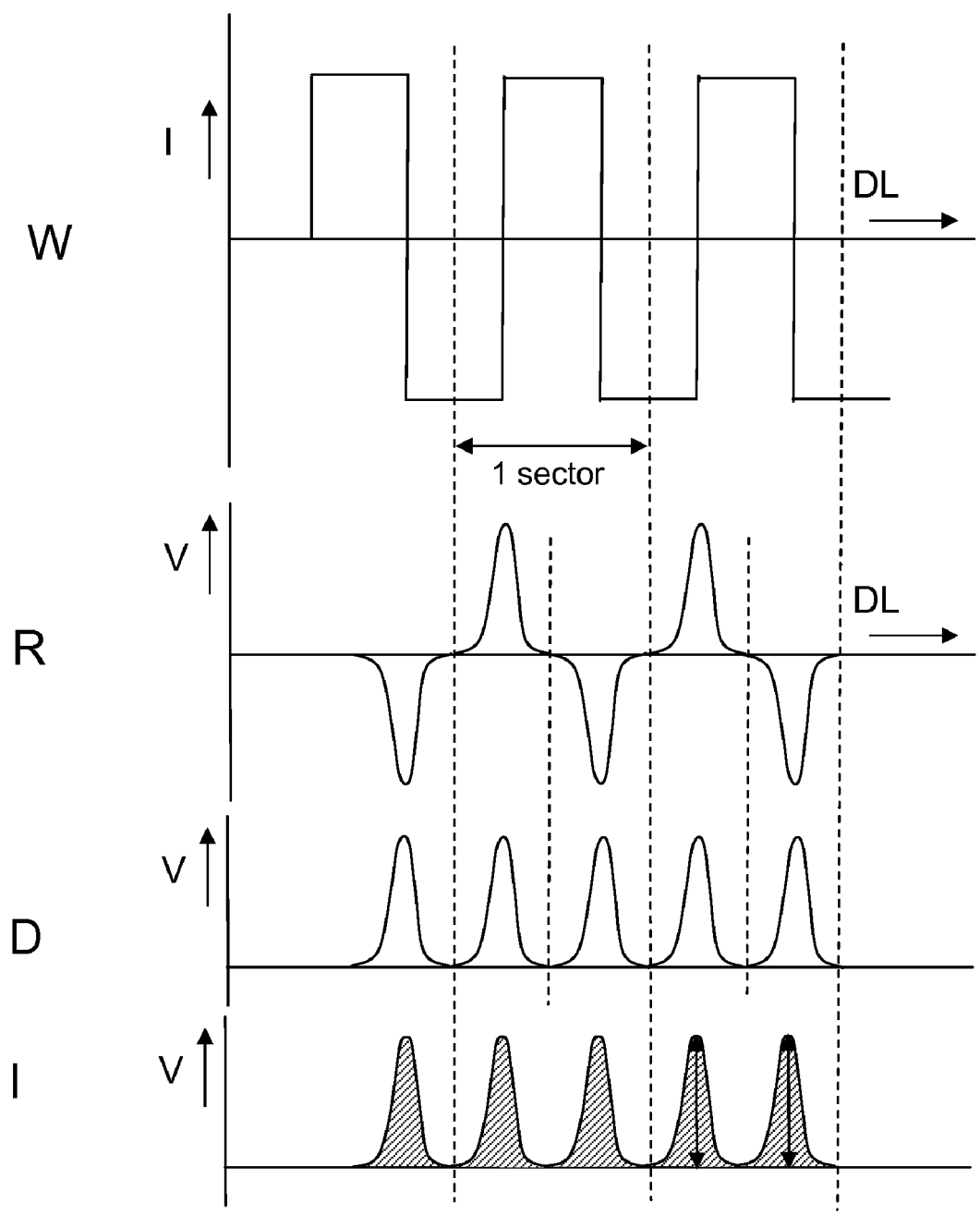
FIG. 16 is a graph of illustrative test measures.

Turning now to FIG. 16, an illustration of measurements done on longitudinal recording medium by analysis software 54 using two transitions per sector is shown (one up and one down) when writes W occur on a disk location DL. In FIG. 16, a write current I is used to create the transitions. Encompassing macroscopic recording head 04 creates such powerful fields these transitions are often sine waves, not the square waves shown in FIG. 16. Encompassing macroscopic recording head 04 cannot write on longitudinal media, however encompassing macroscopic recording head 04 produces results somewhat similar to those shown in FIG. 16, and as more voltage is applied to coils 02, the rise times can be reduced, generating a trapezoidal wave approximating the square waves shown In FIG. 16.

Figure 17:
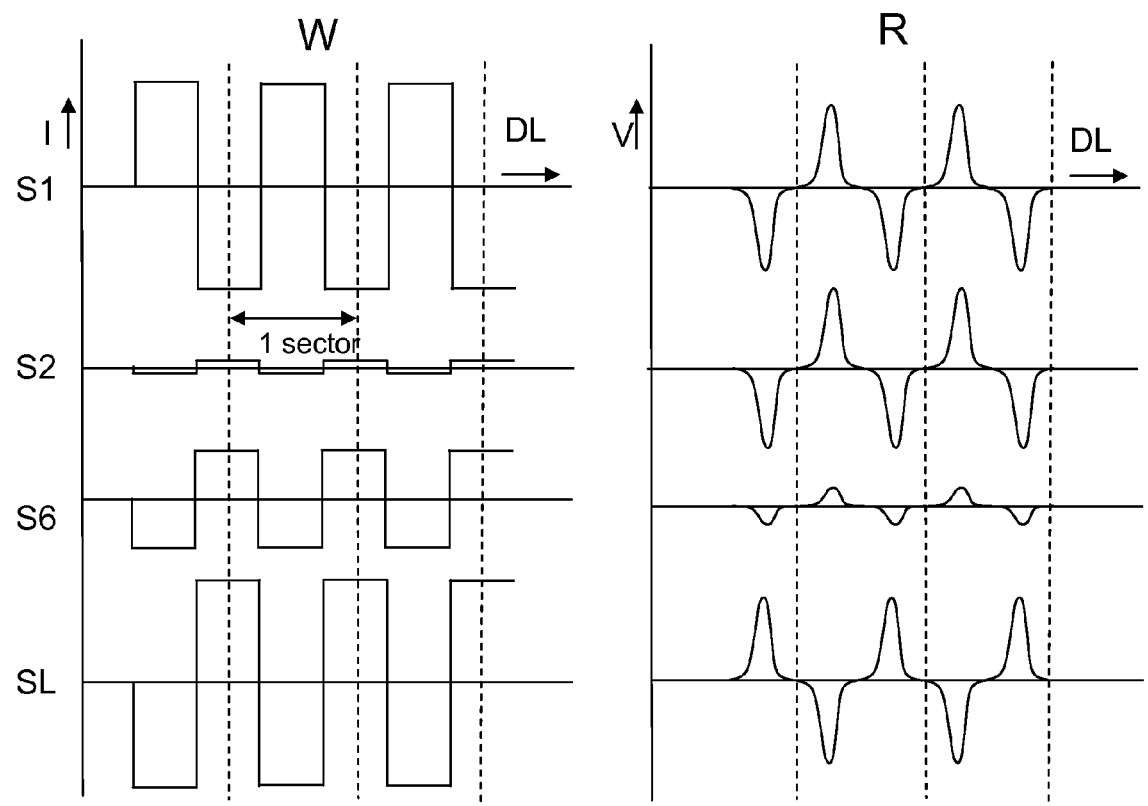
FIG. 17 is a graph of illustrative test measures.

Shown in FIG. 17 are two transitions per sector, one up and one down. Those skilled in the art will appreciate that as few as one transition per sector can be used or more than two can be used, if desired. In the measurements done using the present invention, a read is done after a write in a later revolution of the spindle.

Figure 15:
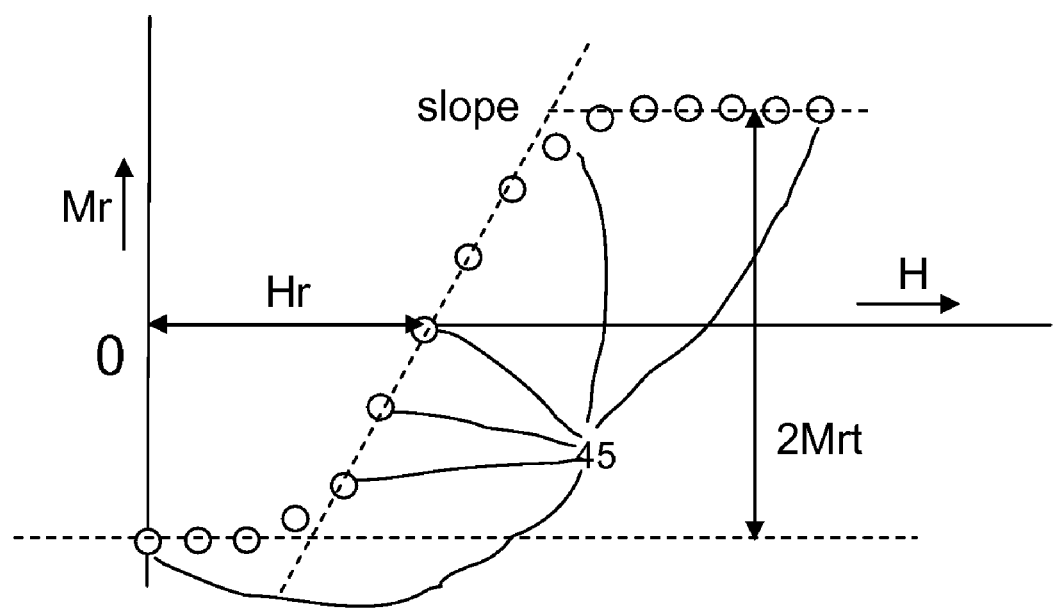
FIG. 15 is a graph of results of tests using the present invention.

Turning now to FIG. 15, in the embodiments shown, the number of points 45 in the remanence curve shown there and the spacing of the fields can be set by software controlling the system of the present invention.

As discussed in connection with FIG. 1A, control software 56 can be used to configure a number of different types of patterns to be used for testing and measurement. For example, recording patterns can be varied as specified above, as can the frequency of such patterns. Control software 56 can also be used to specify the wave shape of the recording pattern to encompassing macroscopic recording head 04, as well as the number of write passes to be made before a read occurs. Similarly, control software 56 can be used to specify the number of read passes, and this, in turn, permits the determination of the thermal stability of the media. Further, control software can specify different media speeds for reading or writing or both. In conjunction with data acquisition and analog interface module 50, control software 56 can also send positioning instructions to the various transport mechanisms used in various types of media tests.

Figure 20:
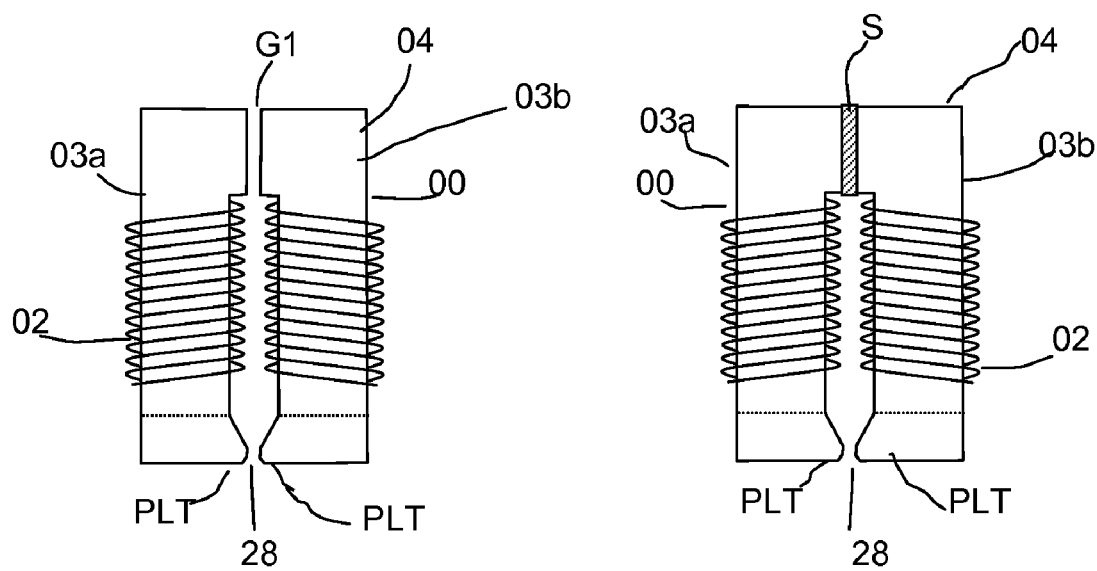
FIG. 20 is a schematic side view of two embodiments of the macroscopic recording head of the present invention.

With reference now to FIG. 20, some additional embodiments of encompassing macroscopic recording head 04 are shown. In these embodiments, yoke 00 is shaped to have either a gap G1 or a shim S between arms 03a and 03b. Where a shim S, is used, it can be filled with a variety of materials, such as a gas, a liquid, a non-magnetic material, a material other than the core material, and so on. In FIG. 20, encompassing macroscopic recording head 04 is shown with two gaps, gap 28 (used for writing) and gap G1. Those skilled in the art will appreciate that yoke 00 can be shaped to have a number of gaps G1 other than write gap 28 without deviating from the scope of the present invention. Similarly, encompassing macroscopic recording head 04 can be closed at almost all points, leaving only gap 28 without deviating from the scope of the present invention.

Still in FIG. 20, poletips PLT of yoke 00 can be tapered on one or both sides to further concentrate the magnetic field.

Figure 21:
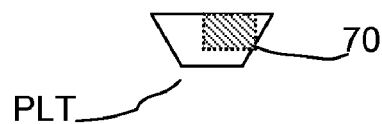
FIG. 21 is a schematic side view of a poletip of the macroscopic recording head of the present invention.

Turning now to FIG. 21, it can be seen that a sensor 70, can be mounted on one or more poletips PLT of encompassing macroscopic recording head 04. Sensor 70 can be a thermal sensor, for use in measuring thermal properties, or a proximity sensor, for use in measuring the distance of PLT above magnetic recording medium layer 06, or a magnetic field sensor for measuring the magnetic field, or a combination thereof.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A metrology system for measuring the magnetic properties of a device used for perpendicular recording, the device having a first side having a magnetic recording medium layer thereon, the system comprising:
   a macroscopic recording head communicating with a computer, the macroscopic recording head comprising a yoke and at least one magnetic field generating element for generating a magnetic field, the yoke having a first magnetic pole capable of being positioned above the first side of the device having a magnetic recording medium layer thereon and a second magnetic pole capable of being positioned opposite the first magnetic pole and below a second side of the device, the positioning of the first and second magnetic poles providing magnetic flux closure through the device;
   a transport mechanism capable of communicating with the device and with the macroscopic recording head, the transport mechanism capable of positioning and movement of the device and the yoke relative to each other;
   a current applied to the magnetic field generating element of the macroscopic recording head, the current being sufficient to generate magnetic fields to create perpendicularly magnetized transitions in the magnetic recording media layer when the device is positioned between the first and second magnetic poles of the yoke and the transport mechanism effects movement of the device and the yoke relative to each other; and
   at least one read element above a side of the device having a magnetic recording medium layer thereon, the read element communicating with the transport mechanism and the read element translating the transitions recorded by the macroscopic recording head into signals for processing and analysis of the magnetic properties of the device.

2. The system of claim 1, wherein the yoke further comprises a yoke shaped so that its first and second magnetic poles are capable of writing a wide track width on the magnetic recording medium layer.

3. The system of claim 1, wherein the yoke further comprises a yoke shaped so that its first and second magnetic poles are capable of writing a narrow track width on the magnetic recording medium layer.

4. The system of claim 1, wherein the yoke further comprises a yoke shaped so that its first and second magnetic poles are spaced apart so that the gap between them accommodates the thickness of the device being measured.

5. The system of claim 1, wherein the yoke further comprises a laminated yoke.

6. The system of claim 1, wherein the yoke further comprises a sintered yoke.

7. The system of claim 1, wherein the yoke further comprises a solid core yoke.

8. The system of claim 1, wherein the yoke further comprises a yoke comprised of two arms spaced apart from each other to form a single gap through which a device can be completely inserted.

9. The system of claim 1, wherein the yoke further comprises a yoke comprised of two arms forming a write gap and connected by a shim at a location apart from the write gap.

10. The system of claim 9, wherein the shim further comprises a gas filled enclosure.

11. The system of claim 9, wherein the shim further comprises a liquid filled enclosure.

12. The system of claim 9, wherein the shim further comprises an enclosure filled with a non-magnetic material.

13. The system of claim 9, wherein the shim further comprises an enclosure filled with a magnetic material other than the material of the yoke.

14. The system of claim 1, wherein the yoke further comprises a yoke forming a plurality of first magnetic poles.

15. The system of claim 1, wherein the yoke further comprises a yoke forming a plurality of second magnetic poles.

16. The system of claim 1, wherein the transport mechanism further comprises a motor for moving the device radially about a spindle.

17. The system of claim 1, wherein the transport mechanism further comprises a motor for moving the device linearly along a path.

18. The system of claim 1, wherein the transport mechanism further comprises a movable stage for moving the macroscopic recording head in relation to the device.

19. The system of claim 1, wherein the read element further comprises a read head positioned above one side of the device.

20. The system of claim 1, wherein the read element further comprises a first read head positioned above one side of the device and a second read head positioned below an opposite side of the device.

21. The system of claim 1, wherein the read element further comprises a plurality of first read heads positioned above one side of the device and a plurality of second read heads positioned below an opposite side of the device.

22. The system of claim 1, wherein the read element further comprises at least one static magnetic field positioned in relation to a read head to reduce noise.

23. The system of claim 1, wherein the read element further comprises a field generated by a coil powered by a direct current positioned in relation to a read head to reduce and stabilize signals coming from layers other than the magnetic recording medium layer.

24. The system of claim 1, wherein the read element further comprises an alternating current field positioned in relation to a read head to reduce and stabilize signals coming from layers other than the magnetic recording medium layer.

25. The system of claim 1, wherein the read element further comprises an arbitrary wave shape field arranged in conjunction with a read head to reduce and stabilize signals coming from layers other than the magnetic recording medium layer.

26. The system of claim 1, wherein the yoke further comprises a yoke having at least one coil for generating a magnetic field.

27. The system of claim 1, wherein the yoke further comprises a yoke shaped to meet at a plurality of points other than between the first and second magnetic poles.

28. The system of claim 1, wherein the yoke further comprises a yoke shaped to have a plurality of gaps filled with a material different from the yoke material.

29. The system of claim 1, further comprising a computer arranged to communicate with the macroscopic recording head, wherein the computer further comprises software for specifying a recording pattern to the macroscopic recording head.

30. The system of claim 29, wherein the computer further comprises software for specifying a frequency for repetition of the recording pattern to the macroscopic recording head.

31. The system of claim 29, wherein the computer further comprises software for specifying a wave shape for the recording pattern to the macroscopic recording head.

32. The system of claim 1, further comprising a computer arranged to communicate with the macroscopic recording head, wherein the computer further comprises software for specifying a number of write passes to be made by macroscopic recording head before reading occurs.

33. The system of claim 1, further comprising a computer arranged to communicate with the macroscopic recording head, wherein the computer further comprises software for specifying a number of read passes.

34. The system of claim 33, wherein the specified number of read passes permits the determination of thermal stability parameters of the magnetic recording medium layer.

35. The system of claim 1, further comprising a computer arranged to communicate with the macroscopic recording head, wherein the computer further comprises software for specifying a plurality of media speeds for reading and writing.

36. The system of claim 1, further comprising a computer arranged to communicate with the macroscopic recording head and a transport mechanism capable of communicating with the device and with the macroscopic recording head, the transport mechanism capable of positioning and movement, wherein the computer further comprises a data acquisition module for communicating with the macroscopic recording head, the transport mechanism, the read element and the computer.

37. The system of claim 36, wherein the computer further comprises software for communicating positioning instructions to and from the data acquisition and analog interface module and to and from the transport mechanism.

38. The system of claim 1, wherein the yoke further comprises a yoke shaped to have a one-sided profile at poletips tapered toward the magnetic recording medium layer of the device to concentrate the magnetic field.

39. The system of claim 1, wherein the yoke further comprises a yoke shaped to have a two-sided profile at poletips tapered toward the magnetic recording medium layer of the device to concentrate the magnetic field.

40. The system of claim 1, wherein the computer further comprises software for specifying the operation of the macroscopic recording head at a plurality of duty cycles.

41. The system of claim 1, wherein the macroscopic recording head further comprises a macroscopic recording head having a thermal sensor mounted thereon.

42. The system of claim 1, wherein the macroscopic recording head further comprises a macroscopic recording head having a proximity sensor mounted thereon.

43. The system of claim 1, wherein the macroscopic recording head further comprises a macroscopic recording head having a magnetic field sensor mounted thereon.

44. The system of claim 1, wherein the device further comprises a hard drive disk platter having a magnetic recording medium layer on both sides.

45. The system of claim 1, wherein the device further comprises a magnetic tape.

46. The system of claim 1, wherein the device further comprises a magnetic card.

47. The system of claim 1, wherein the transport mechanism further comprises a transport mechanism for moving the macroscopic recording head and the read element in relation to a stationary device.

48. An apparatus for measuring the magnetic properties of a device used for perpendicular recording, the device having a first side having a magnetic recording medium layer thereon, the apparatus comprising:
a macroscopic recording head communicating with a computer, the macroscopic recording head comprising a yoke and at least one magnetic field generating means for generating a magnetic field, the yoke having a first magnetic pole capable of being positioned above the first side of the device having a magnetic recording medium layer thereon and a second magnetic pole capable of being positioned opposite the first magnetic pole and below a second side of the device, the positioning of the first and second magnetic poles providing magnetic flux closure through the device;
a positioning and movement unit for positioning and movement of the device relative to the macroscopic recording head;
a means for applying current to the magnetic field generating element of the macroscopic recording head, the current being sufficient to generate magnetic fields to create perpendicularly magnetized transitions in the magnetic recording media layer when the device is positioned between the first and second magnetic poles of the yoke; and
at least one reading element positioned above a side of the device the reading element communicating with the positioning and movement unit and the reading element translating the transitions recorded by the macroscopic recording head into signals for processing and analysis of the magnetic properties of the device.

* * * * *